United States Patent
Joshi et al.

(10) Patent No.: US 12,382,616 B2
(45) Date of Patent: Aug. 5, 2025

(54) OIL-COOLED RECTIFIER DIODE ASSEMBLY

(71) Applicant: Hamilton Sundstrand Corporation, Charlotte, NC (US)

(72) Inventors: Ashutosh Joshi, Roscoe, IL (US); Eric A. Carter, Monroe, WI (US); Debabrata Pal, Hoffman Estates, IL (US); Coralyn J. Saxby, Davis, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 335 days.

(21) Appl. No.: 18/088,194

(22) Filed: Dec. 23, 2022

(65) Prior Publication Data
US 2024/0215210 A1    Jun. 27, 2024

(51) Int. Cl.
*H05K 7/20*     (2006.01)
*H02M 7/00*     (2006.01)

(52) U.S. Cl.
CPC ........ *H05K 7/20927* (2013.01); *H02M 7/003* (2013.01)

(58) Field of Classification Search
CPC ............ H05K 7/1432; H05K 7/14329; H05K 7/20254; H05K 7/20854; H05K 7/20872; H05K 7/209; H05K 7/20927; H02M 7/003; H01H 9/52; H01L 23/473; H01L 23/4006; H02G 5/10
See application file for complete search history.

(56) References Cited

U.S. PATENT DOCUMENTS

| | | | | |
|---|---|---|---|---|
| 3,333,163 A * | 7/1967 | Wislocky | ............... | H01L 25/03 257/688 |
| 4,896,062 A * | 1/1990 | Pollard | ................. | H01L 25/117 363/145 |
| 4,975,825 A * | 12/1990 | Huss | ...................... | H02K 11/05 361/736 |
| 5,831,409 A * | 11/1998 | Lindberg | ............... | B60L 50/51 318/811 |
| 6,016,007 A * | 1/2000 | Sanger | ................. | H01L 23/473 257/E23.098 |
| 9,035,507 B2 | 5/2015 | Wirsch, Jr. et al. | | |
| 10,057,974 B2 | 8/2018 | Pal | | |
| 10,103,604 B2 | 10/2018 | Chitsaz et al. | | |
| 2009/0052134 A1 | 2/2009 | Casteel et al. | | |
| 2009/0161301 A1* | 6/2009 | Woody | .................. | H05K 7/209 361/678 |

(Continued)

FOREIGN PATENT DOCUMENTS

DE     102019203399 A1     9/2020
JP     2005-057130 A     3/2005

OTHER PUBLICATIONS

European Search Report dated May 13, 2024 in connection with European Patent Application No. 23211325.8, 8 pages.

*Primary Examiner* — Jayprakash N Gandhi
*Assistant Examiner* — Steven Ngo

(57) ABSTRACT

A liquid-cooled rectifier assembly includes first and second bus bars, each having at least one cooling channel formed therein, which are adapted and configured to carry a cooling fluid therethrough, and a first power diode array arranged between and in contact with the first and second bus bars. A third bus bar can be provided, along with a second power diode array.

17 Claims, 14 Drawing Sheets

(56) References Cited

U.S. PATENT DOCUMENTS

| | | | |
|---|---|---|---|
| 2010/0302733 A1* | 12/2010 | Woody | H05K 7/20927 |
| | | | 361/689 |
| 2014/0319673 A1 | 10/2014 | Zhou et al. | |
| 2020/0266401 A1* | 8/2020 | Stuetz | B60L 50/64 |
| 2022/0209630 A1 | 6/2022 | Wojcik et al. | |
| 2022/0244296 A1* | 8/2022 | Yamaura | H02M 1/0009 |

* cited by examiner

OIL-COOLED RECTIFIER DIODE ASSEMBLY

BACKGROUND OF THE INVENTION

Although generally considered satisfactory for their intended purpose, aircraft generator rectifier assemblies include diodes packaged in modules, wherein a die is mounted to a substrate and the substrate is, in-turn, mounted to a cold plate, through which oil circulates. Sometimes fins are added to the cooling path to improve cooling performance, as well as other modifications that often do not substantially improve performance, and which sometimes negatively impact overall weight. For example, as schematically illustrated by diode assembly 100 of FIG. 1, a flow of oil 190 passes through a channel 131 formed in a cold plate 130, in which fins 133 are provided. Heat is transferred from the diodes 110, through a substrate 120 to the cold plate 130 and ultimately to the fluid 190. Occasionally, this relatively inefficient arrangement can result in a very low or even negative thermal margin, when under high power load with a hot cooling oil condition.

Accordingly, Applicants recognize that improved structures and related methods to optimize cooling of power electronics would be advantageous. The devices, systems and related methods of the present disclosure provide solutions for this need.

SUMMARY OF THE INVENTION

In accordance with the present invention, devices, systems and methods are provided that relate to fluid-cooled rectifier diode assemblies with reduced volume and weight, and enhanced cooling characteristics, as compared with the prior art.

In accordance with one aspect, a liquid-cooled rectifier assembly includes a first bus bar having at least one cooling channel formed therein, adapted and configured to carry a cooling fluid therethrough, a second bus bar having at least one cooling channel formed therein, adapted and configured to carry the cooling fluid therethrough, and a first power diode array arranged between and in contact with the first and second bus bars.

The first and second bus bars can define outer walls of a fluid chamber, cooling fluid entering the chamber and being distributed, at least in-part, through cooling channels formed in the first and second bus bars.

The first and second bus bars can define outer walls of a fluid chamber, cooling fluid entering the chamber and being distributed, at least in-part, around the outer surface of the first power diode array.

The first bus bar can have a plurality of cooling channels formed therein. The second bus bar can have a plurality of cooling channels formed therein.

The subject liquid-cooled rectifier assemblies can further include at least one bolt, adapted and configured to compress the first and second bus bars onto the first power diode array, in order to optimize electrical and thermal contact between the first and second bus bars and the first power diode array.

The subject liquid-cooled rectifier assemblies can further include at least one spring element, adapted and configured to, in combination with the at least one bolt, compress the first and second bus bars onto the first power diode array, in order to optimize electrical and thermal contact between the first and second bus bars and the first power diode array.

The subject liquid-cooled rectifier assemblies can further include a third bus bar having at least one cooling channel formed therein, adapted and configured to carry the cooling fluid therethrough, and a second power diode array arranged between and in contact with the second and third bus bars. The third bus bar can have a plurality of cooling channels formed therein.

At least one bolt can be provided, adapted and configured to compress the second and third bus bars onto the second power diode array, in order to optimize electrical and thermal contact between the second and third bus bars and the second power diode array.

At least one spring element can be provided, adapted and configured to, in combination with the at least one bolt, compress the second and third bus bars onto the second power diode array, in order to optimize electrical and thermal contact between the second and third bus bars and the second power diode array.

In accordance with one aspect of the invention, the first and third bus bars can define outer walls of a fluid chamber, cooling fluid entering the chamber and being distributed, at least in-part, through cooling channels formed in the first, second and third bus bars.

The first and third bus bars can be formed from aluminum or an aluminum alloy, and the second bus bar is formed from copper or a copper alloy.

In accordance with another aspect of the invention, a method of cooling a rectifier diode assembly includes the steps of providing a first bus bar having at least one cooling channel formed therein, adapted and configured to carry a cooling fluid therethrough, providing a second bus bar having at least one cooling channel formed therein, adapted and configured to carry the cooling fluid therethrough, providing a first power diode array arranged between and in contact with the first and second bus bars, and passing a cooling fluid through the first and second bus bars, thereby cooling the first power diode array.

In accordance with this and other aspects of the invention, the cooling fluid can be oil. The oil can be turbine sump oil.

BRIEF DESCRIPTION OF THE DRAWINGS

So that those skilled in the art to which the subject disclosure appertains will readily understand how to make and use the devices, systems and methods of the subject disclosure without undue experimentation, embodiments thereof will be described in detail herein below with reference to certain figures, wherein.

DETAILED DESCRIPTION OF THE INVENTION

Figure 1:
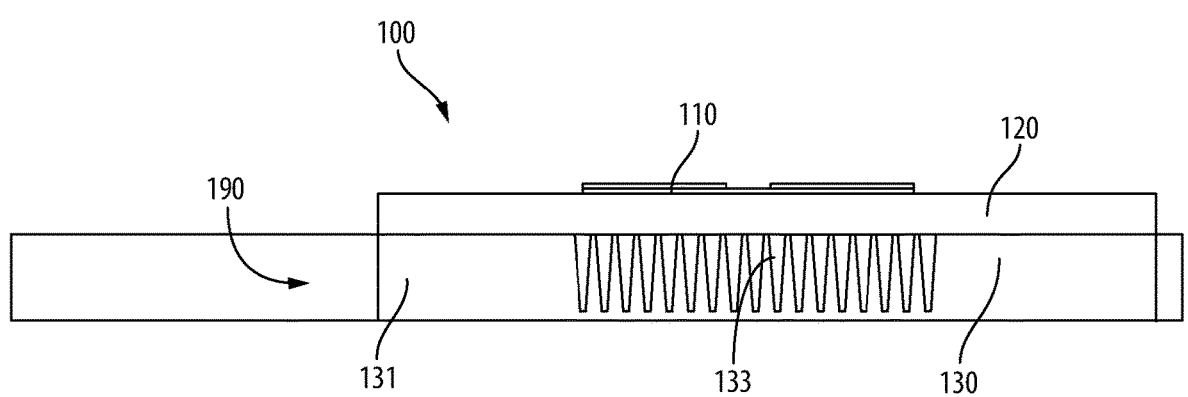
FIG. 1 is a schematic cross-sectional view of a cooled diode assembly in accordance with the prior art.

Reference will now be made to the drawings wherein like reference numerals identify similar structural features or aspects of the subject disclosure.

Figure 2:
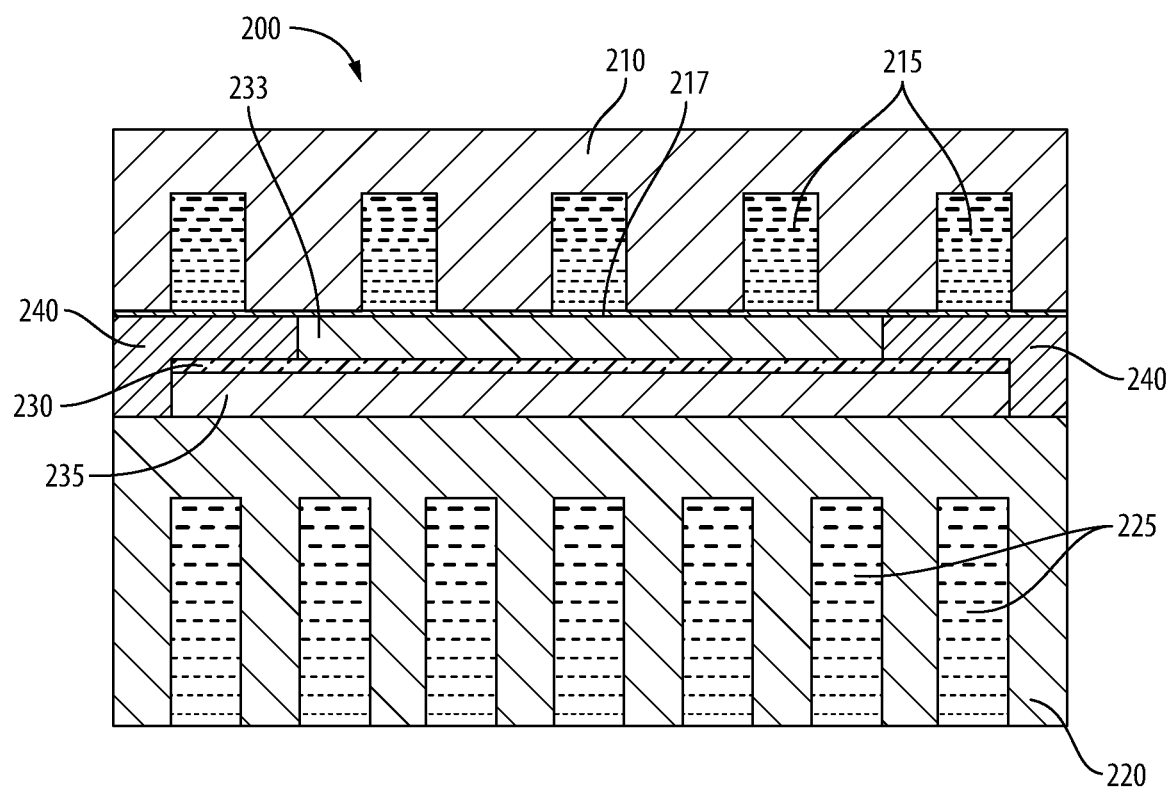
FIG. 2 is a schematic cross-sectional end view of an oil-cooled rectifier diode assembly in accordance with one aspect of the present invention having a single layer of one or more diodes.

As illustrated in FIG. 2, and in accordance with one aspect of the present invention, an oil-cooled rectifier diode assembly 200 is illustrated. One or more diodes 230 are arranged between bus bars 210, 220. The first bus bar 210 includes fluid channels 215 formed therein, and can optionally include a parting sheet 217 to optimize fluid flow characteristics along the upper surface of the diode 230—in this case, the anode 233. Similarly, the second bus bar 220 includes fluid channels 225 formed therein, and can also optionally include a parting sheet to close the lower end of fluid channel 225 to optimize fluid flow characteristics. The bus bars 210, 220 can be formed by any suitable techniques, including but not limited to casting, extrusion and/or machining. Further, the bus bars 210, 220 can each be formed of a single piece, or formed by joining multiple pieces together. The bus bars 210, 220 can be formed out of any suitable material, which is preferably highly thermally and electrically conductive. In that regard, copper and aluminum are preferred as practical choices, with aluminum advantageously offering weight savings-naturally an important factor in aeronautical applications. Yet in certain high-current applications, copper may be preferred over aluminum, as will be described in more detail below.

An insulating material 240 can be provided to stabilize the diodes 230, which itself can have cooling channels formed therethrough. Alternatively, these areas occupied by the insulating material 240 can be left open to allow free passage of cooling fluid over the exposed surfaces of the diode(s) 230, anode(s) 233 and cathode(s) 235.

As will be further appreciated in discussion of alternate embodiments below, the quality of electrical and thermal contact between the diode electrodes 233, 235 and respective bus bars 210, 220 is important for successful and reliable operation. Therefore, a continuous force is preferably exerted on the diode(s) by the bus bars. This force can be applied in any suitable manner, but in accordance with one preferred aspect, the force is achieved by way of a plurality of bolts and resilient biasing members, such as springs, which are illustrated and described herein in connection with other embodiments.

Figure 3:
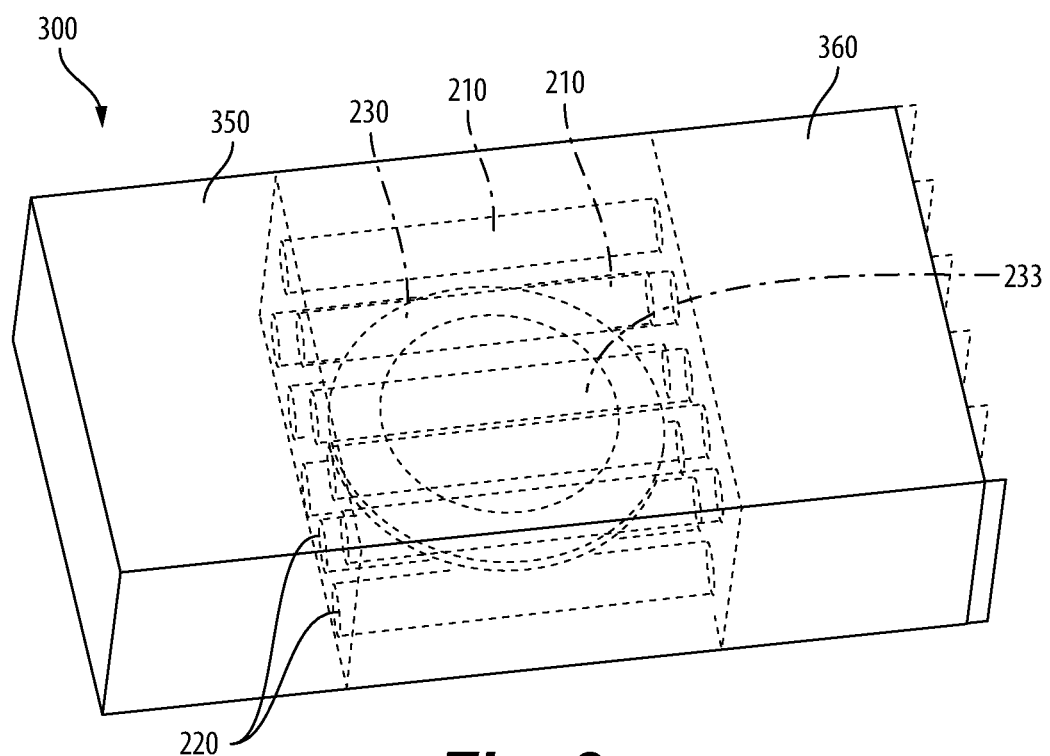
FIG. 3 is an isometric view of an oil-cooled rectifier diode assembly in accordance with another aspect of the present invention, illustrating cooling fluid plenums on each end of cooling channels.

With reference to FIG. 3, an isometric view of an oil-cooled rectifier diode assembly 300 is illustrated, having cooling fluid plenums 350, 360 on each end of cooling channels formed in bus bars 210, 220. Fluid is provided from a cooling fluid circuit, which can be a cooled engine oil circuit, for example, to a supply plenum 350, from where it flows through channels formed in bus bars 210, 220 to an output plenum 360, from where the fluid returns to the cooling fluid circuit. In the illustrated embodiment, an alternate round cross-sectional geometry of cooling channels is shown. Such geometries can be fabricated in a conventional manner, such as by extrusion, and/or machining, or by newer technologies such as additive manufacturing techniques. Such techniques can be applied to all embodiments described herein.

Figure 4:
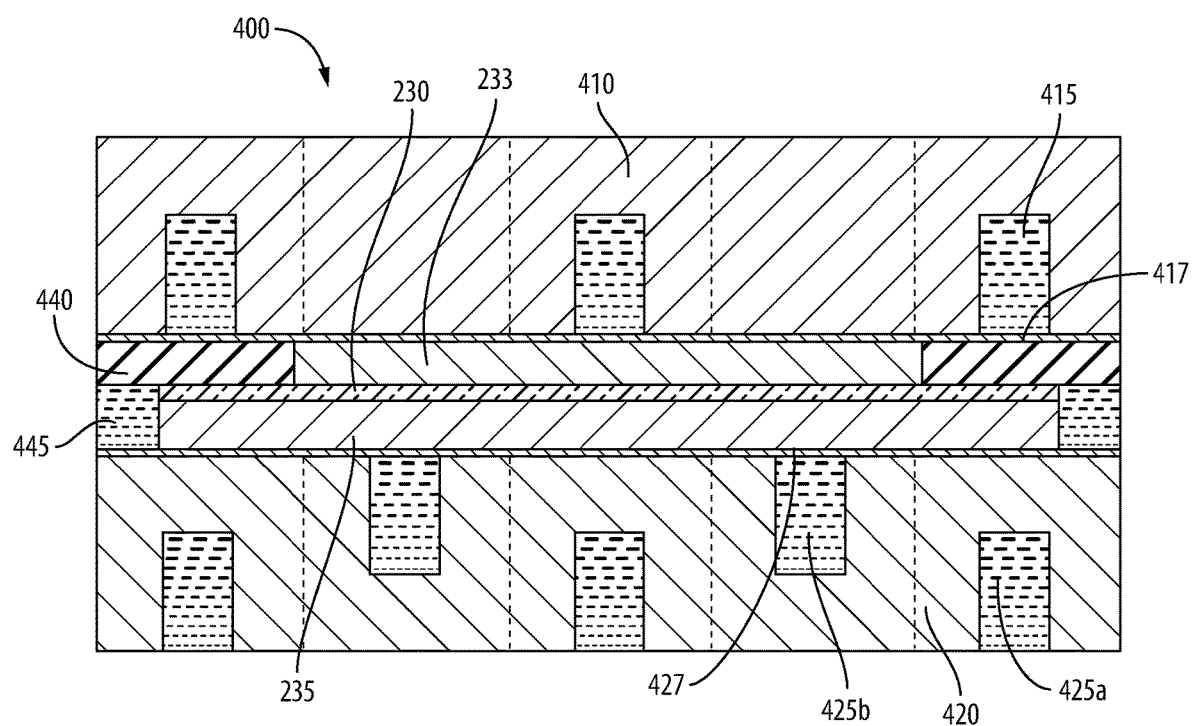
FIG. 4 is a schematic cross-sectional end view of an oil-cooled rectifier diode assembly in accordance with still another aspect of the present invention, illustrating alternate arrangements for cooling channels in bus bars.

FIG. 4 is a schematic cross-sectional end view of an oil-cooled rectifier diode assembly 400 in accordance with still another aspect of the present invention, including alternate arrangements for cooling channels 415, 425a, 425b in bus bars 410, 420.

One or more diodes 230 are arranged between bus bars 410, 420. The first bus bar 410 includes fluid channels 415 formed therein. In this embodiment, channels 415 are spaced further apart than in the embodiment of FIG. 2. The first bus bar 410 can optionally include a parting sheet 417 to optimize fluid flow characteristics along the upper surface of the diode 230.

Similarly, the second bus bar 420 includes fluid channels 425a, 425b formed therein in an alternating manner, as compared with the embodiment of FIG. 2. The second bus bar 420 can optionally include a parting sheet 427 to close the upper end of fluid channel 425b to optimize fluid flow characteristics. Additionally, another parting sheet can be applied to the lower end of fluid channels 425a.

As with other embodiments described herein, the bus bars 410, 420 can be formed by any suitable techniques, including but not limited to casting, extrusion and/or machining. Further the bus bars 410, 420 can each be formed of a single piece, or formed by joining multiple pieces together. The bus bars 410, 420 can be formed out of any preferably highly thermally and electrically conductive material. Copper and aluminum are preferred as practical choices, but other materials can be used, depending on the desired implementation.

An insulating material 440 can be provided to stabilize the diodes 230, which itself can have cooling channels formed therethrough. Alternatively, these areas occupied by the insulating material 440 can be left open to allow free passage of cooling fluid over the exposed surfaces of the diode(s) 230, anode(s) 233 and cathode(s) 235. The embodiment of FIG. 4 further includes additional cooling channels 445 arranged between the insulating material 440 and the second bus bar 420. Such channels 445 can be defined simply by the boundary of the adjacent structures, or can alternatively be housed in a separate conduit.

Figure 5:
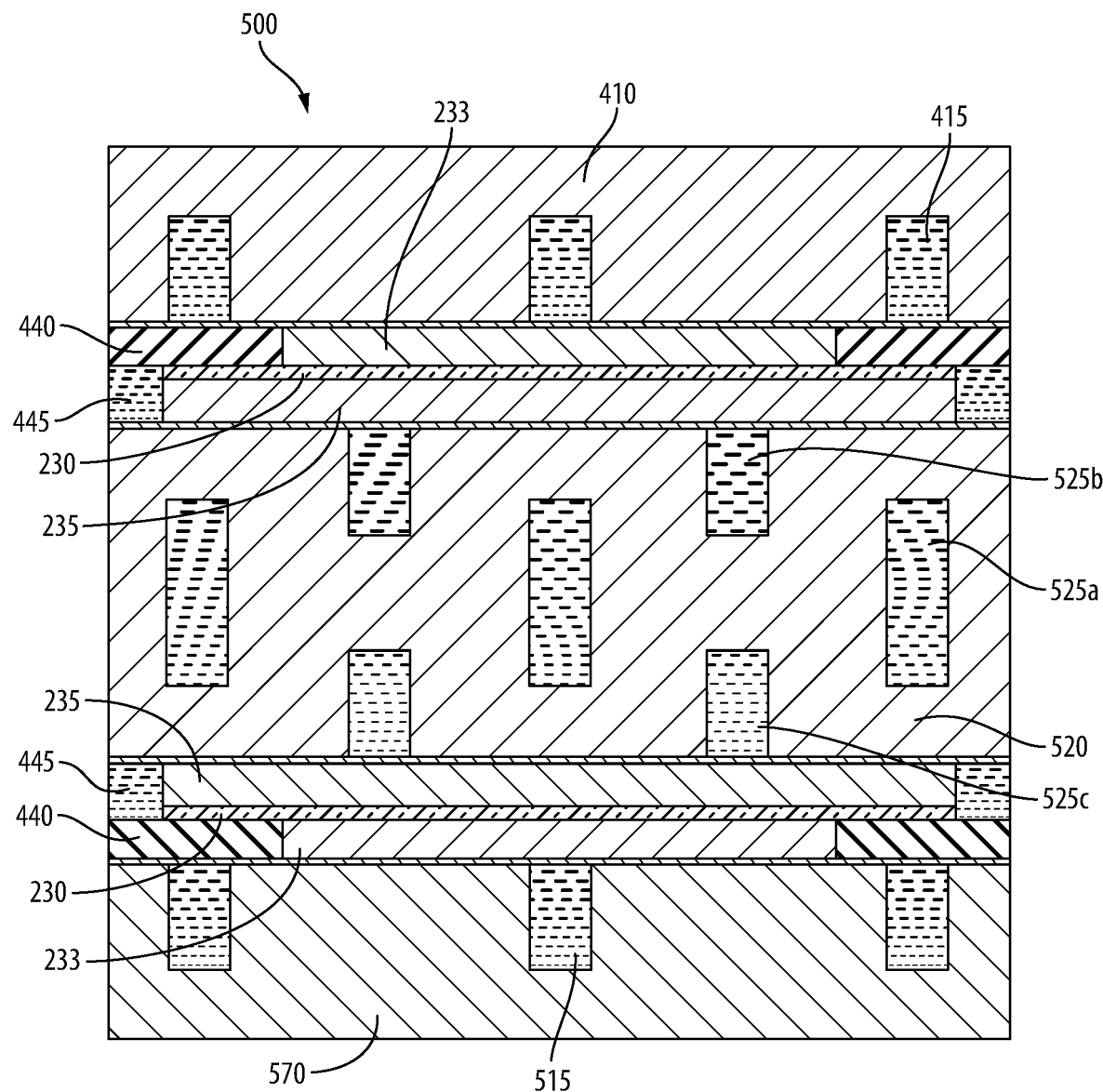
FIG. 5 is a schematic cross-sectional end view of an oil-cooled rectifier diode assembly in accordance with a further aspect of the present invention, in which a second level of one or more diodes is provided on the lower face of an intermediate bus bar.

FIG. 5 is a schematic cross-sectional end view of an oil-cooled rectifier diode assembly 500 in accordance with a further aspect of the present invention, in which a second level of one or more diodes is provided on the lower face of an intermediate bus bar 520, and a third bus bar 570 is also provided. In such an arrangement, the intermediate bus bar 520 can be utilized as the AC bus bar, with outer bus bars being utilized for DC.

One or more diodes 230 are arranged in a first array between bus bars 410, 520. As with foregoing embodiments, the first bus bar 410 includes fluid channels 415 formed therein. The first bus bar 510 can optionally include a parting sheet to optimize fluid flow characteristics along the upper surface of the diode 230. Similarly, the second bus bar 520 includes fluid channels 525a, 525b, 525c formed therein. The second bus bar 520 can optionally include a parting sheet to close the upper end of fluid channel 525b and another parting sheet can be applied to the lower end of fluid channels 525c to optimize fluid flow characteristics, if desired.

As used herein, the term "array" means an arrangement of one or more individual diodes. Such an array can include a single diode, or multiple diodes arranged in any pattern.

Further, one or more diodes 230 are arranged in a second array between bus bars 520, 570. The third bus bar 570 includes fluid channels 515 formed therein. The third bus bar 570 can optionally include a parting sheet to optimize fluid flow characteristics along the lower surface of the adjacent diode(s) 230.

As with other embodiments described herein, the bus bars 410, 520, 570 can be formed by any suitable techniques, including but not limited to casting, extrusion and/or machining. Further the bus bars 410, 520, 570 can each be formed of a single piece, or formed by joining multiple pieces together. The bus bars 410, 520, 570 can be formed out of any preferably highly thermally and electrically conductive material. Copper and aluminum are preferred as practical choices, but other materials can be used, depending on the desired implementation.

As with the embodiment of FIG. 4, an insulating material 440 can be provided to stabilize the diodes 230, which itself can have cooling channels formed therethrough. Alternatively, the areas occupied by the insulating material 440 can be left open to allow free passage of cooling fluid over the exposed surfaces of the diode(s) 230, anode(s) 233 and cathode(s) 235. The embodiment of FIG. 5 further includes additional cooling channels 445 arranged between the insulating material 440 and the second bus bar 420. Such channels 445 can be defined simply by the boundary of the adjacent structures, or can alternatively be housed in a separate conduit.

Figure 6:
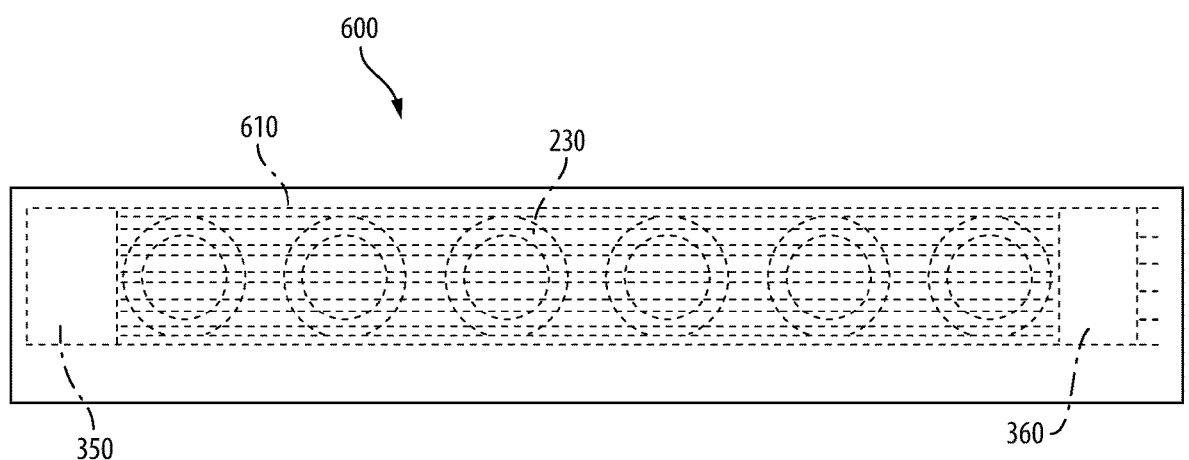
FIG. 6 is a top view of an oil-cooled rectifier diode assembly in accordance with another aspect of the present invention, illustrating multiple diodes arranged in a linear array and cooling fluid plenums on each end of cooling channels.

FIG. 6 is a top view of an oil-cooled rectifier diode assembly 600 in accordance with the present invention, illustrating bus bars 610 having cooling channels, and supply plenum 350 and outlet plenum 360. FIG. 6 illustrates multiple diodes 230 arranged in a linear array, and accordingly it is to be understood that the foregoing embodiments where only cross-sectional end views are shown can represent assemblies having any number of diodes arranged in line, or otherwise, along the common bus bars.

Moreover, this and other embodiments described herein can include diodes arranged laterally from those axially-offset diodes 230 illustrated in FIG. 6. That is, where the embodiment FIG. 3 could be described as having a 1×1 array of diodes 230, and the embodiment of FIG. 6 could be described as having a 1×6 array of diodes 230, all of the diodes being electrically connected in parallel to adjacent bus bars, alternate arrangements of diode arrays are possible and well within the scope of this application. For example, arrays of 2×6, 3×6, 3×3, 4×4, and so on are all possible, and advantageously can be selected based on power requirements, dimensional limitations and thermal characteristics, as needed.

Figure 7:
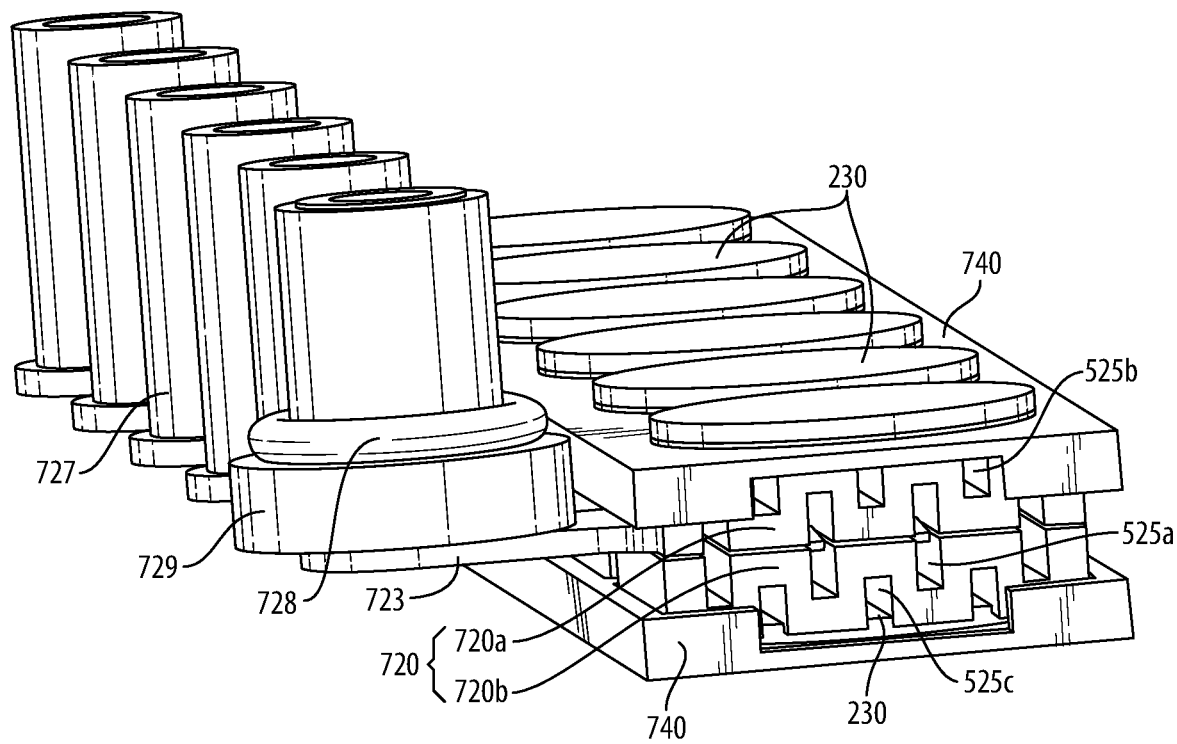
FIG. 7 is an isometric view illustrating a middle bus bar having cooling channels, outer power connections, and adjacent diodes.

FIG. 7-13 illustrate various components of an oil-cooled rectifier diode assembly 1200 in accordance with the invention. Of these, FIG. 7 is an isometric view illustrating a middle or intermediate bus bar 720 composed of stacked plates 720a. 720b having cooling channels 525a, 525b, 525c formed therein. In the illustrated embodiment, upper middle bus bar 720a includes, extending off of connectors 723, power connections 727, which connections 727 are configured to receive insulators 729 to allow the connections to pass through adjacent bus bars (particularly first outer bus bar 810) having different polarity, as will be seen in connection with additional drawings described hereinbelow. In accordance with a preferred embodiment of the invention, sealing elements, in this case, O-rings 728 are provided to seal against the outer portions of the assembly. In this manner, loss of cooling fluid from the internal passageways is reduced, and component cooling is thereby enhanced.

As with the embodiment of FIG. 5, a two levels of diodes 230 are provided, respectively on the upper and lower faces of the intermediate bus bar 720, although only the upper level is fully visible in FIG. 7.

The entire assembly of FIG. 7 is essentially held within outer bus bars 810, 1070 (described in connection with the following figures), which form a fluid path around and through the assembly of FIG. 7 In that manner, the upper diodes 230 are arranged in a first array between outer bus bar 810 and inner bus bar 720, and the lower diodes 230 are arranged in a second array between the inner bus bar 720 and the outer bus bar 1070.

Figure 9:
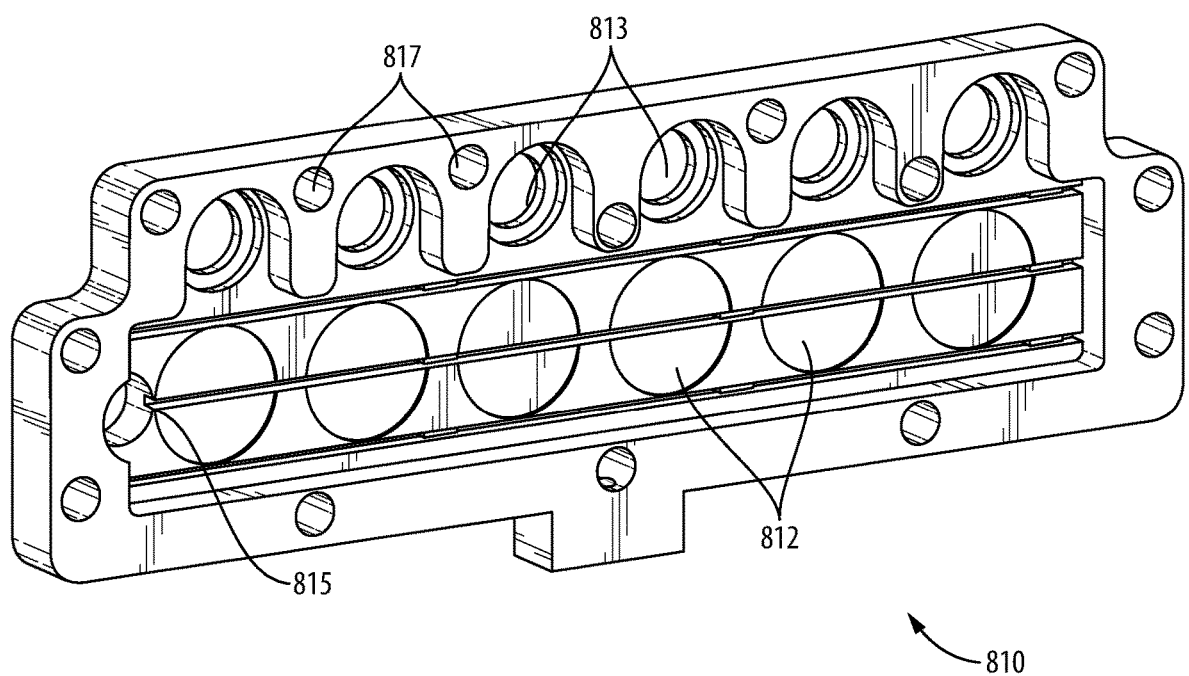
FIG. 9 is an isometric view of an inner surface of the example first outer bus bar of FIG. 8, illustrating an integral cooling fluid channel and surface contours to enhance mechanical, thermal and electrical connection to adjacent diodes.

As best seen in FIG. 9, the first outer bus bar 810 includes fluid channels 815 formed therein. The first outer bus bar 810 can optionally include a parting sheet to optimize fluid flow characteristics along the upper surface of the diode 230. Similarly, the inner bus bar 720 includes fluid channels 525a, 525b, 525c formed therein. The inner bus bar 720 can optionally include a parting sheet to close the upper end of fluid channel 525b and another parting sheet can be applied to the lower end of fluid channels 525c to optimize fluid flow characteristics, if desired. The third bus bar 570 includes fluid channels 515 formed therein. The third bus bar 570 can optionally include a parting sheet to optimize fluid flow characteristics along the lower surface of the adjacent diode(s) 230.

As with other embodiments described herein, the bus bars 810, 720, 1070 can be formed by any suitable techniques, including but not limited to casting, extrusion and/or machining. Further the bus bars 810, 720, 1070 can each be formed of a single piece, or formed by joining multiple pieces together. The bus bars 810, 720, 1070 can be formed out of any preferably highly thermally and electrically conductive material. Copper and aluminum are preferred as practical choices, but other materials can be used, depending on the desired implementation.

As with previously described embodiments, an insulating material 740 can be provided to stabilize the diodes 230, which itself can have cooling channels formed therethrough. Alternatively, the areas occupied by the insulating material 740 can be left open to allow free passage of cooling fluid over the exposed surfaces of the diode(s) 230, anode(s) 233 and cathode(s) 235.

As with other embodiments having multiple levels of diodes, the diodes of one array are flipped with respect to the diodes of the opposing array, so that the polarity allows sharing of intermediate bus bar 720, leaving the outer bus bars 810, 1070 with a common opposite polarity.

Figure 8:
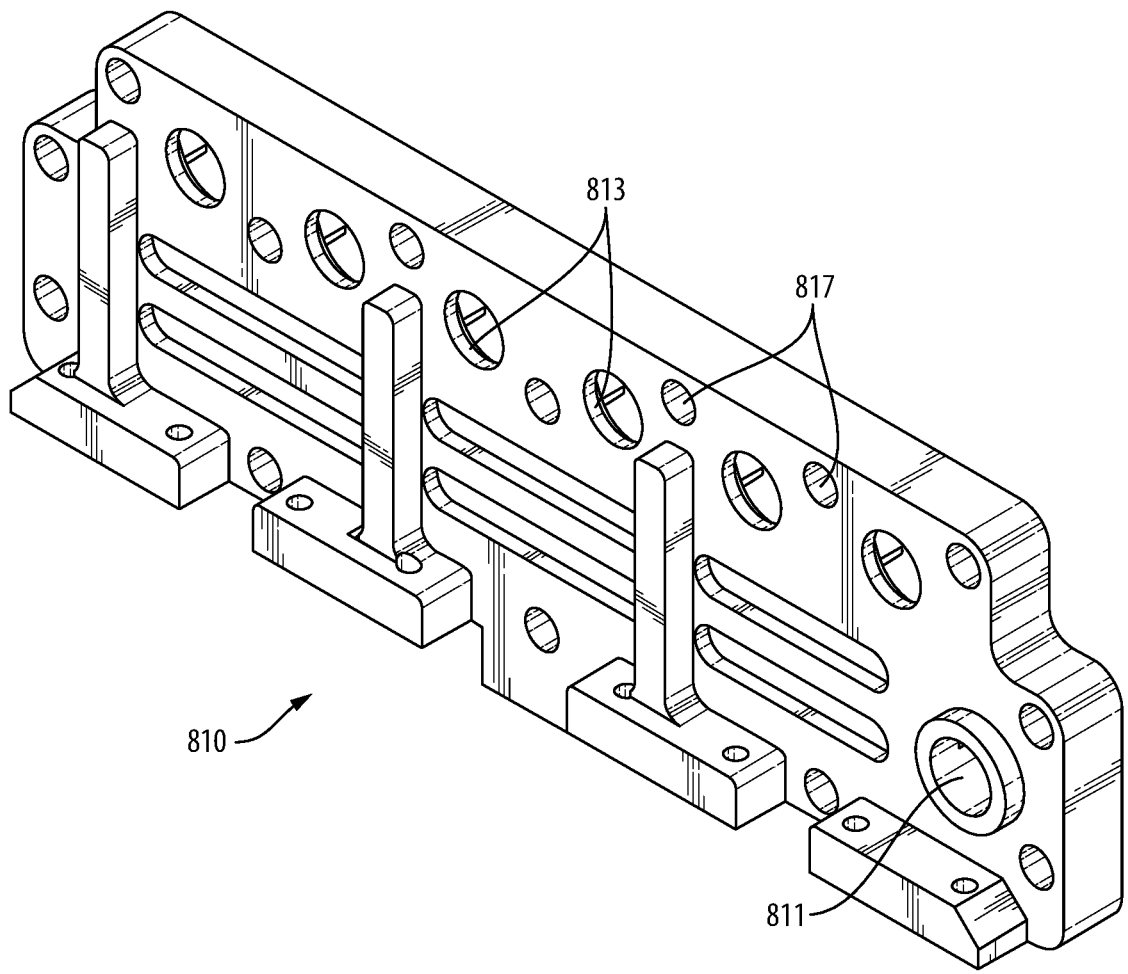
FIG. 8 is an isometric view of an outer surface of an example first outer bus bar in accordance with the invention illustrating cooling fluid inlet port and various cutouts to allow for passage of opposing bus bar connections.

FIGS. 8 and 9 are isometric views of outer and inner surfaces of the first outer bus bar 810, respectively. Illustrated are cooling fluid inlet port 811 and various cutouts 813 to allow for passage of opposing bus bar connections 727 and their insulators 729. Notably, bolt holes 817 are also illustrated. With reference to FIG. 9, an integral cooling fluid channel 815 and surface contours 812 to enhance mechanical, thermal and electrical connection to adjacent diodes are also illustrated.

Figure 10:
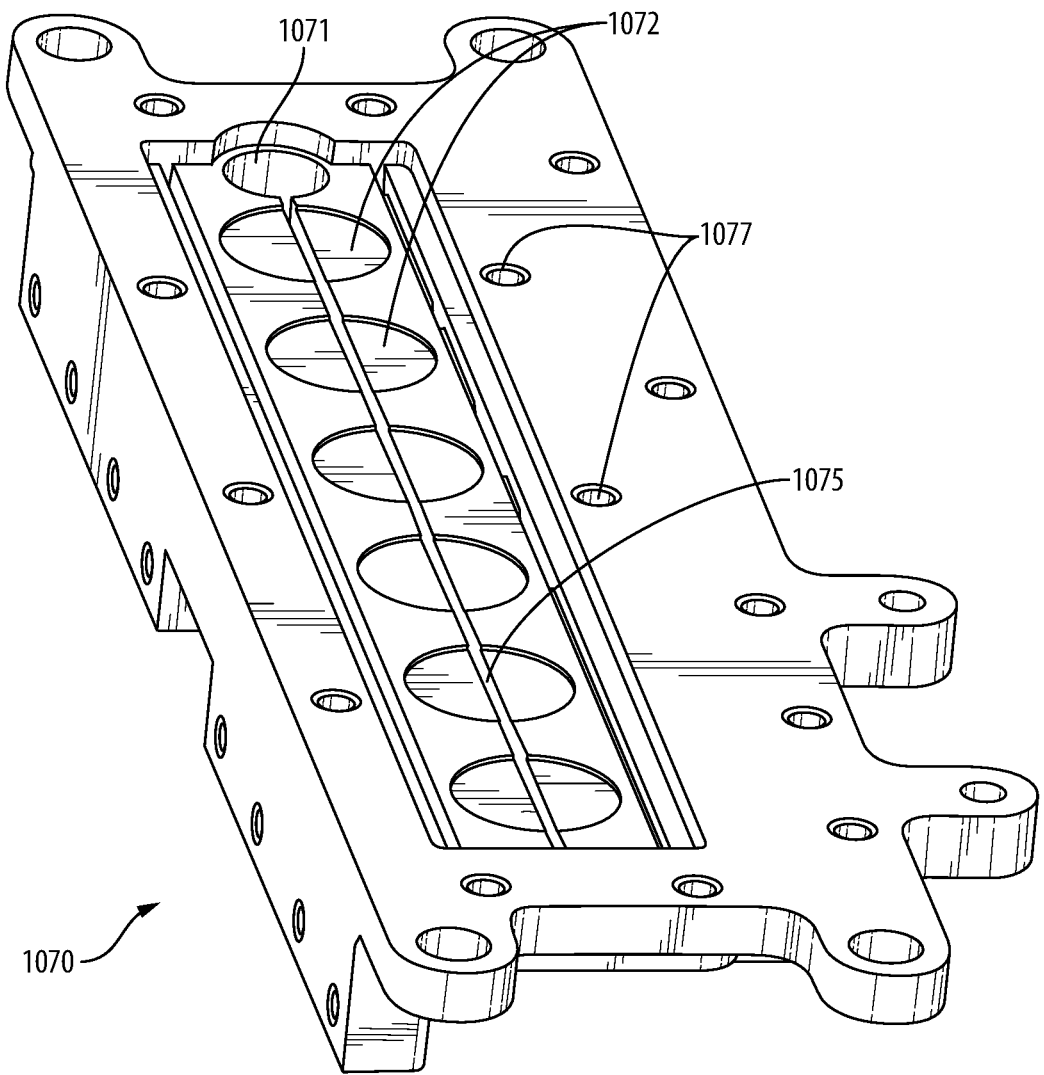
FIG. 10 is an isometric view of an inner surface of an example second outer bus bar in accordance with the invention illustrating an integral cooling fluid channel and surface contours to enhance mechanical, thermal and electrical connection to adjacent diodes.
Figure 11:
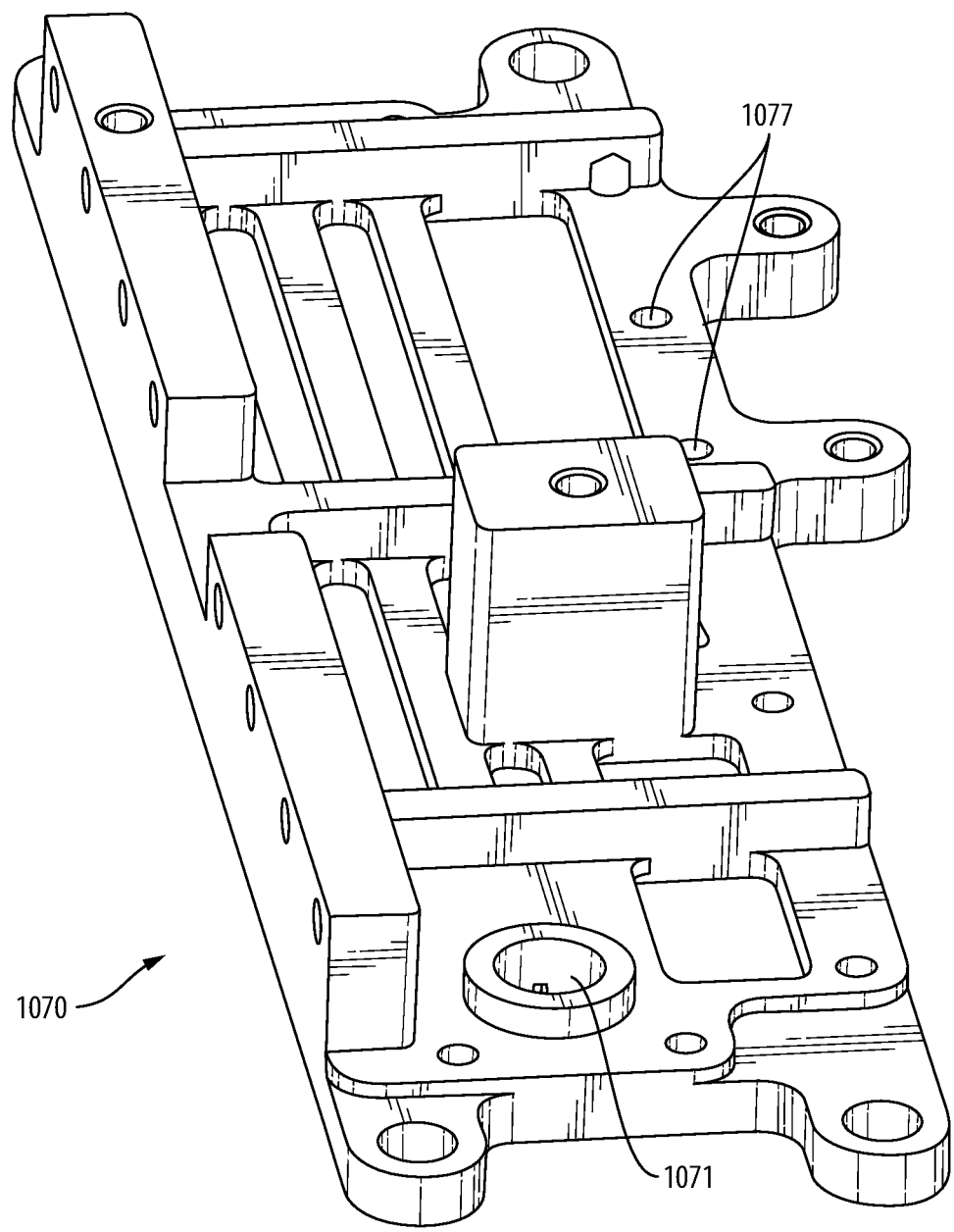
FIG. 11 is an isometric view of an outer surface of the example outer bus bar of FIG. 10, illustrating cooling fluid outlet port.

FIGS. 10 and 11 are isometric views of inner and outer surfaces of the second outer bus bar 1070, respectively. Illustrated are an integral cooling fluid channel 1075 and surface contours 1072 to enhance mechanical, thermal and electrical connection to adjacent diodes. Bolt holes 1077 are also illustrated, along with cooling fluid outlet port 1071.

Figure 12:
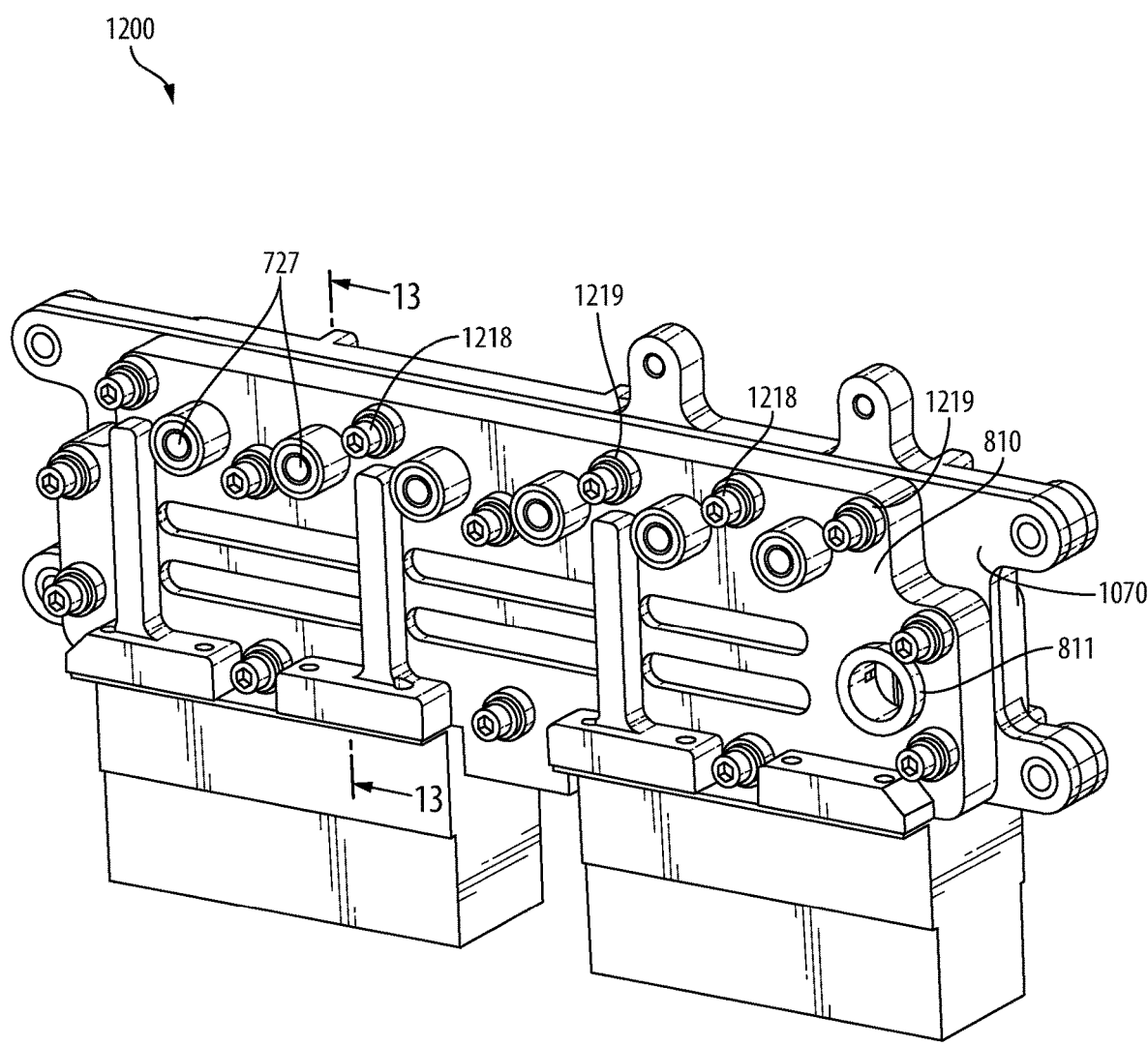
FIG. 12 is an isometric view of an example oil-cooled rectifier diode assembly in accordance with the invention, illustrating various bus connections and mechanical fasteners holding the assembly together.

FIG. 12 is an isometric view of an assembled oil-cooled rectifier diode assembly 1200 in accordance with the invention. Additionally illustrated are assembly bolts 1218 and biasing members 1219 used to maintain contact force within the assembly between bus bars 720, 810, 1070 and the diodes 230. The biasing members 1219 can be any suitable resilient material, such as a spring or elastomeric washer, for example. In the illustrated embodiment, the assembly bolts 1218 pass from first outer bus bar 810, through to the opposing second outer bus bar 1070, and compress biasing members 1219 in the process, which maintain contact force between the diodes 230 and bus bars 720, 810, 1070.

Figure 13:
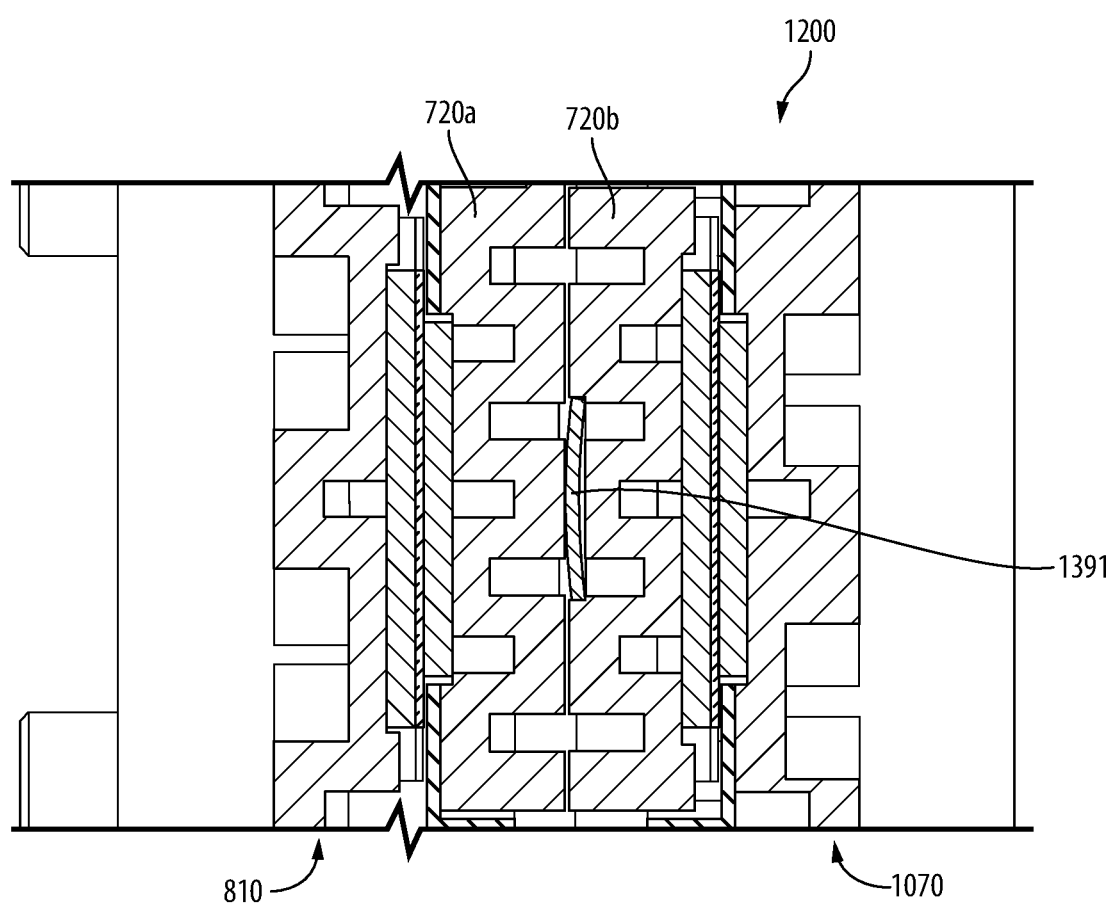
FIG. 13 is cross-sectional view of the example oil-cooled rectifier diode assembly of FIG. 12.

FIG. 13 is a cross-sectional view of the oil-cooled rectifier diode assembly 1200, illustrating particularly a cupped spring washer 1391, of which multiple can be provided along the length of the assembly 1200. The washers provide compression force to the components of the assembly 1200. Such washers 1391 can, generally, be referred to as "Belleville" type washers, for example.

In use, cooling fluid is directed from an cooling fluid system into the inlet port 811, and distributed through the cooling channels of the bus bars 720, 810, 1070, exiting through outlet port 1071 back to the system.

Figure 14:
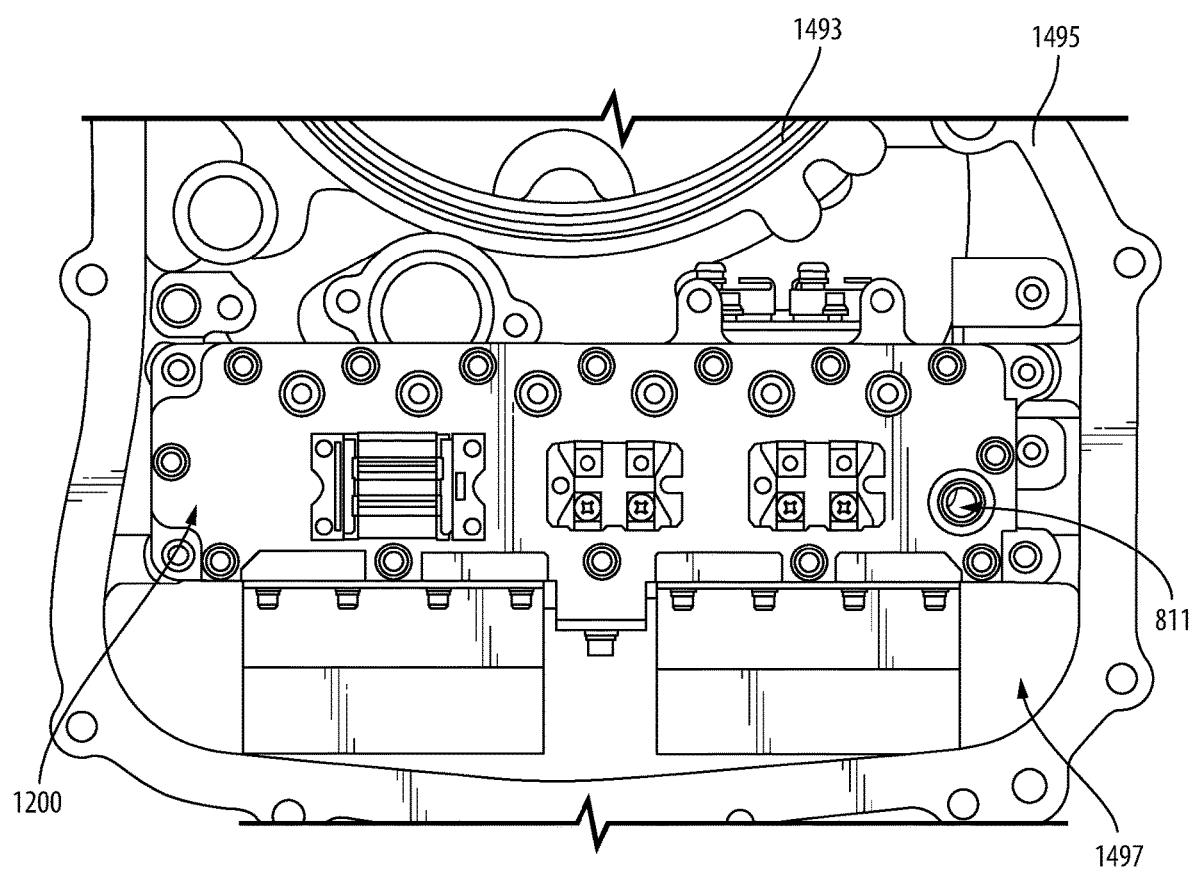
FIG. 14 is an illustration showing an example positioning of the oil-cooled rectifier diode assembly of FIG. 12 within a generator housing

As illustrated in FIG. 14, if desired, the entire rectifier diode assembly 1200 can be wetted in engine sump oil to enhance cooling, depending on the application. As illustrated, the rectifier 1200 is held within a housing 1495, adjacent the connected generator 1493. As such, circulating oil can advantageously be utilized for cooling of the rectifier through circulation into port 811, and thereby through the above-discussed internal channels, and also through external contact with oil held within the sump area 1497.

Although it is conceived that the cooling fluid described herein will typically be oil, it should be understood that the present invention is not limited to using only oil. Typically, a dielectric oil operating in a wide temperature range will be selected, but any electrically nonconductive fluid can be used.

While the devices, systems and methods of the subject disclosure have been shown and described with reference to embodiments, those skilled in the art will readily appreciate that changes and/or modifications may be made thereto without departing from the spirit and scope of the subject disclosure.

What is claimed is:

1. A liquid-cooled rectifier assembly comprising:
   a first bus bar having at least one cooling channel formed therein, adapted and configured to carry a cooling fluid therethrough;
   a second bus bar having at least one cooling channel formed therein, adapted and configured to carry the cooling fluid therethrough, wherein the at least one cooling channel formed in the second bus bar includes at least one upper cooling channel and at least one lower cooling channel formed therein in an alternating arrangement; and
   a first power diode array arranged between and in contact with the first and second bus bars;
   wherein the first and second bus bars define outer walls of a fluid chamber such that the cooling fluid entering the fluid chamber is distributed, at least in part, around an outer surface of the first power diode array; and
   wherein the first power diode array includes the outer surface as one of an upper surface or a lower surface, and exposed surfaces at which free passage of the cooling fluid occurs between the upper and lower surfaces of the first power diode array.

2. The liquid-cooled rectifier assembly of claim 1, wherein the liquid-cooled rectifier assembly is configured such that the cooling fluid entering the fluid chamber is distributed, at least in-part, through the at least one cooling channel formed in the first bus bar and the at least one upper cooling channel formed in the second bus bar.

3. The liquid-cooled rectifier assembly of claim 2, wherein an upper end of the at least one upper cooling channel is formed on an opposite side of the second bus bar relative to the side of the second bus bar on which a lower end of the at least one lower cooling channel is formed.

4. The liquid-cooled rectifier assembly of claim 1, wherein the at least one cooling channel formed in the first bus bar includes a plurality of cooling channels.

5. The liquid-cooled rectifier assembly of claim 1, wherein the at least one cooling channel formed in the second bus bar includes a plurality of cooling channels.

6. The liquid-cooled rectifier assembly of claim 1, further comprising:
   at least one bolt, adapted and configured to compress the first and second bus bars onto the first power diode array, in order to optimize electrical and thermal contact between the first and second bus bars and the first power diode array.

7. The liquid-cooled rectifier assembly of claim 6, further comprising:
   at least one spring element, adapted and configured to, in combination with the at least one bolt, compress the first and second bus bars onto the first power diode array, in order to optimize electrical and thermal contact between the first and second bus bars and the first power diode array.

8. The liquid-cooled rectifier assembly of claim 1, further comprising:
   a third bus bar having at least one cooling channel formed therein, adapted and configured to carry the cooling fluid therethrough; and
   a second power diode array arranged between and in contact with the second and third bus bars.

9. The liquid-cooled rectifier assembly of claim 8, wherein the at least one cooling channel formed in the third bus bar includes a plurality of cooling channels.

10. The liquid-cooled rectifier assembly of claim 8, further comprising:
at least one bolt, adapted and configured to compress the second and third bus bars onto the second power diode array, in order to optimize electrical and thermal contact between the second and third bus bars and the second power diode array.

11. The liquid-cooled rectifier assembly of claim 10, further comprising:
at least one spring element, adapted and configured to, in combination with the at least one bolt, compress the second and third bus bars onto the second power diode array, in order to optimize electrical and thermal contact between the second and third bus bars and the second power diode array.

12. The liquid-cooled rectifier assembly of claim 8, wherein the liquid-cooled rectifier assembly is configured such that the cooling fluid entering the fluid chamber is distributed, at least in-part, through the cooling channels formed in the first, second, and third bus bars.

13. The liquid-cooled rectifier assembly of claim 8, wherein the first and third bus bars are formed from aluminum or an aluminum alloy, and the second bus bar is formed from copper or a copper alloy.

14. The liquid-cooled rectifier assembly of claim 1, wherein a first diode electrode is wider than a second diode electrode within a respective diode among the first power diode array.

15. A method of cooling a rectifier diode assembly, comprising:
providing a first bus bar having at least one cooling channel formed therein, adapted and configured to carry a cooling fluid therethrough;
providing a second bus bar having at least one cooling channel formed therein, adapted and configured to carry the cooling fluid therethrough, wherein the at least one cooling channel formed in the second bus bar includes at least one upper cooling channel and at least one lower cooling channel formed therein in an alternating arrangement, and wherein the first and second bus bars define outer walls of a fluid chamber;
providing a first power diode array arranged between and in contact with the first and second bus bars, wherein the first power diode array includes an outer surface as one of an upper surface or a lower surface opposite to the upper surface and exposed surfaces at which free passage of the cooling fluid occurs between the upper and lower surfaces of the first power diode array; and
passing the cooling fluid through the first and second bus bars, thereby cooling the first power diode array, wherein passing the cooling fluid through the first and second bus bars includes the cooling fluid entering the fluid chamber and being distributed, at least in part, around the outer surface of the first power diode array.

16. The method of cooling the rectifier diode assembly of claim 15, wherein the cooling fluid is an oil.

17. The method of cooling the rectifier diode assembly of claim 16, wherein the oil is turbine sump oil.

* * * * *